United States Patent
Yu et al.

(10) Patent No.: US 7,249,333 B2
(45) Date of Patent: Jul. 24, 2007

(54) QUANTIFIED BOOLEAN FORMULA (QBF) SOLVER

(75) Inventors: Yuan Yu, Cupertino, CA (US); Lintao Zhang, Sunnyvale, CA (US)

(73) Assignee: Microsoft Corporation, Redmond, WA (US)

( * ) Notice: Subject to any disclaimer, the term of this patent is extended or adjusted under 35 U.S.C. 154(b) by 261 days.

(21) Appl. No.: 11/038,958

(22) Filed: Jan. 18, 2005

(65) Prior Publication Data

US 2006/0190865 A1   Aug. 24, 2006

(51) Int. Cl.
G06F 17/50 (2006.01)
G06F 17/10 (2006.01)

(52) U.S. Cl. .............................................. 716/5; 703/2
(58) Field of Classification Search .................. 716/5; 703/2
See application file for complete search history.

(56) References Cited

U.S. PATENT DOCUMENTS

| 6,131,078 | A  | * | 10/2000 | Plaisted ........................ 703/2 |
| 6,321,186 | B1 | * | 11/2001 | Yuan et al. ..................... 703/15 |
| 6,442,732 | B1 | * | 8/2002 | Abramovici et al. ........... 716/4 |
| 7,031,896 | B1 | * | 4/2006 | Yang ............................ 703/13 |
| 7,058,910 | B2 | * | 6/2006 | Bharadwaj et al. ............ 716/5 |
| 7,107,553 | B2 | * | 9/2006 | Lockyear et al. .............. 716/4 |
| 7,117,463 | B2 | * | 10/2006 | Graham et al. ................ 716/5 |
| 2003/0225552 | A1 | * | 12/2003 | Ganai et al. .................. 703/2 |

OTHER PUBLICATIONS

Zhang, Lintao, et al., "The Quest for Efficient Boolean Satisfiability Solvers," Proceedings of 8th International Conference on Computer Aided Deduction (CADE 2002) and also in Proceedings of 14th Conference on Computer Aided Verification (CAV 2002), Copenhagen, Denmark, Jul. 2002, 20 pages.

Plaisted, David A., et al., "A Satisfiability Procedure for Quantified Boolean Formulae," Preprint submitted to Discrete Applied Mathematics (Mar. 26, 2002), pp. 1-46.

Cadoli, Marco, et al., "An Algorithm to Evaluate Quantified Boolean Formulae," Proceedings of the Fifteenth National Conference on Artificial Intelligence (AAAI-98) and the Tenth Conference on Innovative Applications of Artificial Intelligence (IAAI-98), AAAI Press/The MIT Press, Jul. 1998, 6 pages.

(Continued)

Primary Examiner—Stacy A Whitmore
(74) Attorney, Agent, or Firm—Woodcock Washburn LLP

(57) ABSTRACT

Quantified Boolean formula (QBF) techniques are used in determining QBF satisfiability. A QBF is broken into component parts that are analyzable by a satisfiability (SAT) solver. Each component is then independently, and perhaps in parallel, analyzed for satisfiability. If a component is unsatisfiable, then it is determined that the QBF is unsatisfiable, and the analysis is stopped. If a component is satisfiable, then an assignment corresponding to the satisfiable component is noted. If a component is satisfiable, then it is appended to another untested component to provide a combination component, and the satisfiability of the combination component is analyzed. Such appending and analysis is repeated until the QBF is completed and determined to be satisfiable or determined to be unsatisfiable.

12 Claims, 5 Drawing Sheets

OTHER PUBLICATIONS

Büning, Hans Kleine, et al., "Resolution for Quantified Boolean Formulas," Information and Computation, v. 117, n. 1, Feb. 15, 1995, 3 pages.

http://www4.informatik.tu-meunchen.de/~letz/semprop/, "SEMPROP—A Decision Procedure for Quantified Boolean Formulas," 2002, 2 pages.

http://www.mrg.dist.unige.it/~qube/barLeft.html, QuBE, Quantified Boolean formulas Evaluator, 2001, 2 pages.

http://www.princeton.edu/~chaff/quaffle.html, "Quaffe, Quantified Boolean Formula Evaluator with Learning," 2002, 1 page.

http://www.inf.ethz.ch/personal/biere/projects/quantor/, "QUANTOR QBF Solver," Jan. 2004, 1 page.

http://sra.itc.it/people/benedetti/sKizzo/, "Welcome to the home page of sKizzo a QBF Solver," Nov. 2004, 3 pages.

Flanagan, Cormac, et al., "An Explicating Theorem Prover for Quantified Formulas," Intelligent Enterprise Technologies Laboratory, HP Laboratories Palo Alto, Nov. 2, 2004, 15 pages.

* cited by examiner

QUANTIFIED BOOLEAN FORMULA (QBF) SOLVER

FIELD OF THE INVENTION

The present invention relates generally to the field of computing, and, more particularly, to the quantified Boolean formula satisfiability problem.

BACKGROUND OF THE INVENTION

The propositional Boolean satisfiability (SAT) problem is used in many applications, including software and hardware verification and computer aided design. Many advanced software analysis tools use SAT solving in their reasoning engines.

A propositional Boolean formula consists of Boolean variables connected by logical operators. Example operators include logical and (∧), logical or (∨), and logical negation (¬). Given such a formula, the SAT problem asks the question whether there exists a value assignment for the variables such that the formula evaluates to true under that assignment. The SAT problem is known to be NP-Complete. There exist many algorithms to solve SAT problems efficiently. As used herein, a propositional Boolean formula is simply referred to as a Boolean formula.

A quantified Boolean formula (QBF) is a more general form of Boolean formula that contains quantifiers. Example quantifiers include the universal quantifier ∀ and the existential quantifier ∃. The satisfiability problem for QBF is PSPACE-complete, which is considered to be computationally harder than NP-Complete. Conventional QBF algorithms do not perform well for many real-world applications. More effective QBF techniques are desirable.

One widely used approach to QBF solving is to transform the QBF formula into a quantifier-free Boolean formula that can be solved subsequently by a SAT solver. However, every time this kind of transformation is performed conventionally to eliminate the quantifier(s), a larger formula results, which is undesirable.

In view of the foregoing, there is a need for systems and methods that overcome such deficiencies.

SUMMARY OF THE INVENTION

The following summary provides an overview of various aspects of the invention. It is not intended to provide an exhaustive description of all of the aspects of the invention, nor to define the scope of the invention. Rather, this summary is intended to serve as an introduction to the detailed description and figures that follow.

Example embodiments of the present invention are directed to systems and methods that use QBF techniques in determining QBF satisfiability. A counter-example driven learning procedure combines abstraction and refinement. The satisfiability problem is reduced into a set of similar, but smaller and simpler, subproblems, which are recursively solved in parallel.

Example systems and methods for determining the satisfiability of a QBF comprise receiving a QBF and then breaking the QBF into a plurality of component parts recursively until each of components is analyzable by a satisfiability (SAT) solver. A component consists of a single propositional Boolean formula part and a set of child components. A component is satisfiable if and only if there is a satisfiable assignment of its propositional formula part that makes all its child components unsatisfiable. Each child component is then independently, and perhaps in parallel, analyzed for satisfiability recursively.

According to aspects of the invention, a component calls a SAT solver to find a candidate satisfiable assignment for its propositional formula part, and proposes it to all its child components. If the SAT solver fails to find such a candidate, it is determined that this component is unsatisfiable. If all the child components are unsatisfiable under the proposed assignment, it is concluded that this component is satisfiable and the candidate assignment is a satisfiable assignment for the component. If some of the child components are satisfiable under the proposed assignment, the reasons why they are satisfied will be extracted and added to the component. This process of proposing, analyzing, and learning is desirably repeated until the component is determined to be satisfiable or determined to be unsatisfiable.

Example systems and methods are also directed to solving a QBF by reducing the QBF into a set of propositional Boolean satisfiability problems, and solving the propositional Boolean satisfiability problems, desirably using a SAT solver. Such solving may be performed recursively and in parallel.

Additional features and advantages of the invention will be made apparent from the following detailed description of illustrative embodiments that proceeds with reference to the accompanying drawings.

BRIEF DESCRIPTION OF THE DRAWINGS

The foregoing summary, as well as the following detailed description of preferred embodiments, is better understood when read in conjunction with the appended drawings. For the purpose of illustrating the invention, there is shown in the drawings exemplary constructions of the invention; however, the invention is not limited to the specific methods and instrumentalities disclosed. In the drawings.

DETAILED DESCRIPTION OF ILLUSTRATIVE EMBODIMENTS

Figure 1:
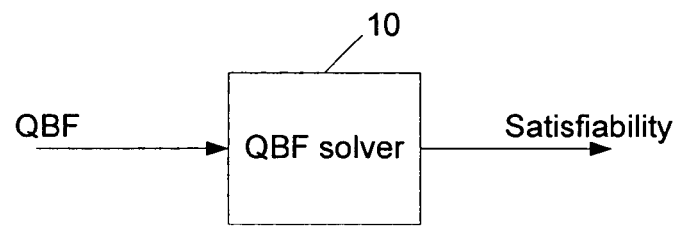
FIG. 1 is a high level block diagram useful in describing aspects of the present invention.

The subject matter is described with specificity to meet statutory requirements. However, the description itself is not intended to limit the scope of this patent. Rather, the inventors have contemplated that the claimed subject matter might also be embodied in other ways, to include different steps or combinations of steps similar to the ones described in this document, in conjunction with other present or future technologies. Moreover, although the term "step" may be used herein to connote different elements of methods employed, the term should not be interpreted as implying any particular order among or between various steps herein disclosed unless and except when the order of individual steps is explicitly described.

As used herein, the following symbols are defined: $\wedge$ is logical or, $\vee$ is logical and, and $\neg$ is logical not (negation). Exemplary quantifiers include universal and existential, represented as $\forall$ and $\exists$, respectively.

A quantified Boolean formula (QBF) is a generalized form of a Boolean formula that contains quantifiers. A quantifier can be universal or existential. As defined, universal $\wedge x \ f(x)=f(true) \vee f(false)$, and existential $\exists x f(x)=f(true) \wedge f(false)$. A variable that is quantified is called a bounded variable, while a variable that is not quantified is called a free variable. For example, $P(x) \vee \forall y \ Q(x, y)$ is a QBF. The variable y in the example is a bounded variable, while x is a free variable. A QBF is satisfiable if there is an assignment to all the (free) Boolean variables such that the formula evaluates to true under that assignment. A QBF satisfiability problem is to determine if a QBF is satisfiable, and give at least one such assignment when it is satisfiable.

Formally, the syntax of a QBF is defined as follows:

$$f::=x|\neg f|f \vee g|f \wedge g|\wedge x f|\exists x f$$

where x denotes a Boolean variable, and f and g denote Boolean formulas. Because the existential quantifier can be eliminated by applying the identity $\exists x \ f=\neg \forall x \neg f$, a QBF is assumed to contain no existential quantification in the remainder of the description. It is contemplated that universal quantifiers may be eliminated instead, with appropriate changes to the techniques set forth below.

A QBF formula is valid if the formula evaluates to true under all possible assignments. It is desirable to determine if a formula is valid. A formula is valid if and only if its negation is unsatisfiable.

Conventional SAT solvers address simpler Boolean satisfiability problems. Aspects of the present invention reduce QBF satisfiability into a set of propositional Boolean satisfiability problems that can be solved by SAT solvers. As noted above, it is desirable to transform a QBF formula into a Boolean formula, in which no quantifier is present. The most commonly used technique is expansion using the definitions of $\forall$ and $\exists$. However, every time an expansion is performed to eliminate quantifiers, a larger formula results, which is undesirable. Embodiments of the present invention avoid doing the expansion, and efficiently determine whether the formula is satisfiable.

Put another way, it is desirable to prove that a formula $P(x,y,z)$ is valid (true), in which case this formula is true for all possible values of x, y, z. The formula is converted to a satisfiability problem of $\neg P(x,y,z)$. If $\neg P(x,y,z)$ is unsatisfiable, then $P(x,y,z)$ is valid. If P contains quantifiers, this becomes complicated. One prior art technique is to use expansion, which is undesirable.

FIG. 1 is a high level block diagram useful in describing aspects of the present invention. A QBF is provided to a QBF solver 10. The QBF solver 10, using example techniques described herein, determines whether the QBF is satisfiable or not. It is often desirable to provide one or more satisfiable assignment when the QBF is satisfiable.

Figure 2:
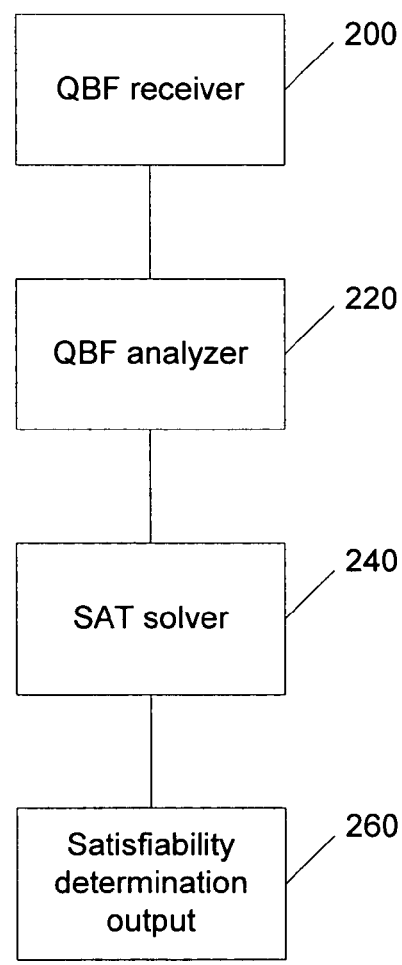
FIG. 2 is a block diagram of an exemplary system in accordance with the present invention.

FIG. 2 is a block diagram of an exemplary system in accordance with the present invention. All or parts of the system shown in FIG. 2 may be comprised within a QBF solver, such as the QBF solver 10. A QBF receiver 200 is adapted to receive a QBF. A QBF analyzer 210 analyzes the QBF, and breaks it into the appropriate components for subsequent analysis and solving, e.g., by a satisfiability (SAT) solver 240. SAT solvers are well known, and any appropriate SAT solver may be used to reach the desired solutions, as described further herein. The determination of QBF satisfiability or unsatisfiability is then provided via an output 260.

Figure 3:
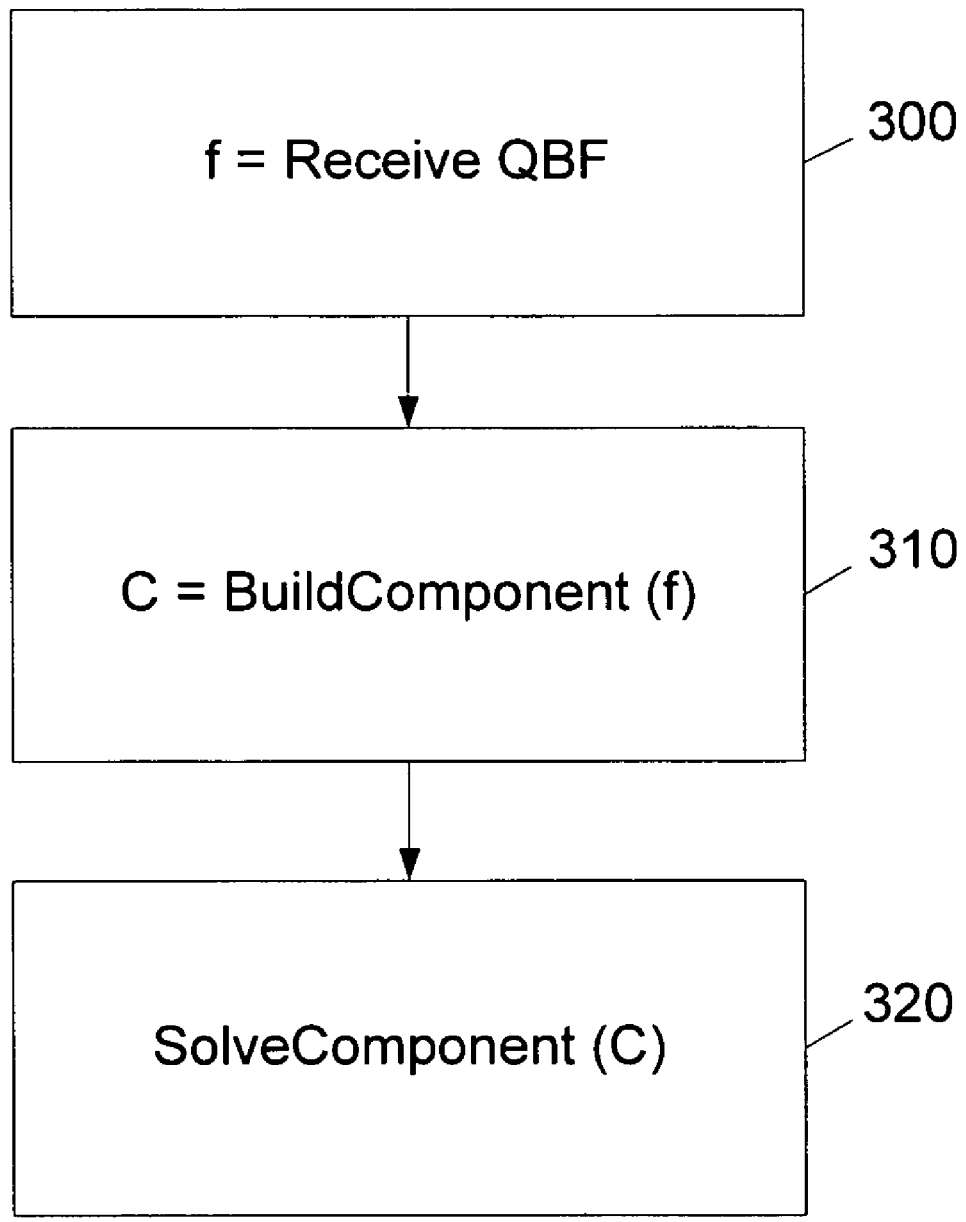
FIG. 3 is a flow diagram of an exemplary method of solving a QBF in accordance with the present invention.

FIG. 3 is a flow diagram of an exemplary method of solving a QBF in accordance with the present invention. A QBF is received at step 300, and reduced into a set of components, for example by invoking the procedure BuildComponent, at step 310. The satisfiability of a component is then solved, for example by invoking the procedure SolveComponent, at step 320. Details of exemplary BuildComponent and SolveComponent are described herein. It is noted that BuildComponent and SolveComponent are examples only, and it is contemplated that these procedures can be intertwined and/or built on demand.

Figure 4:
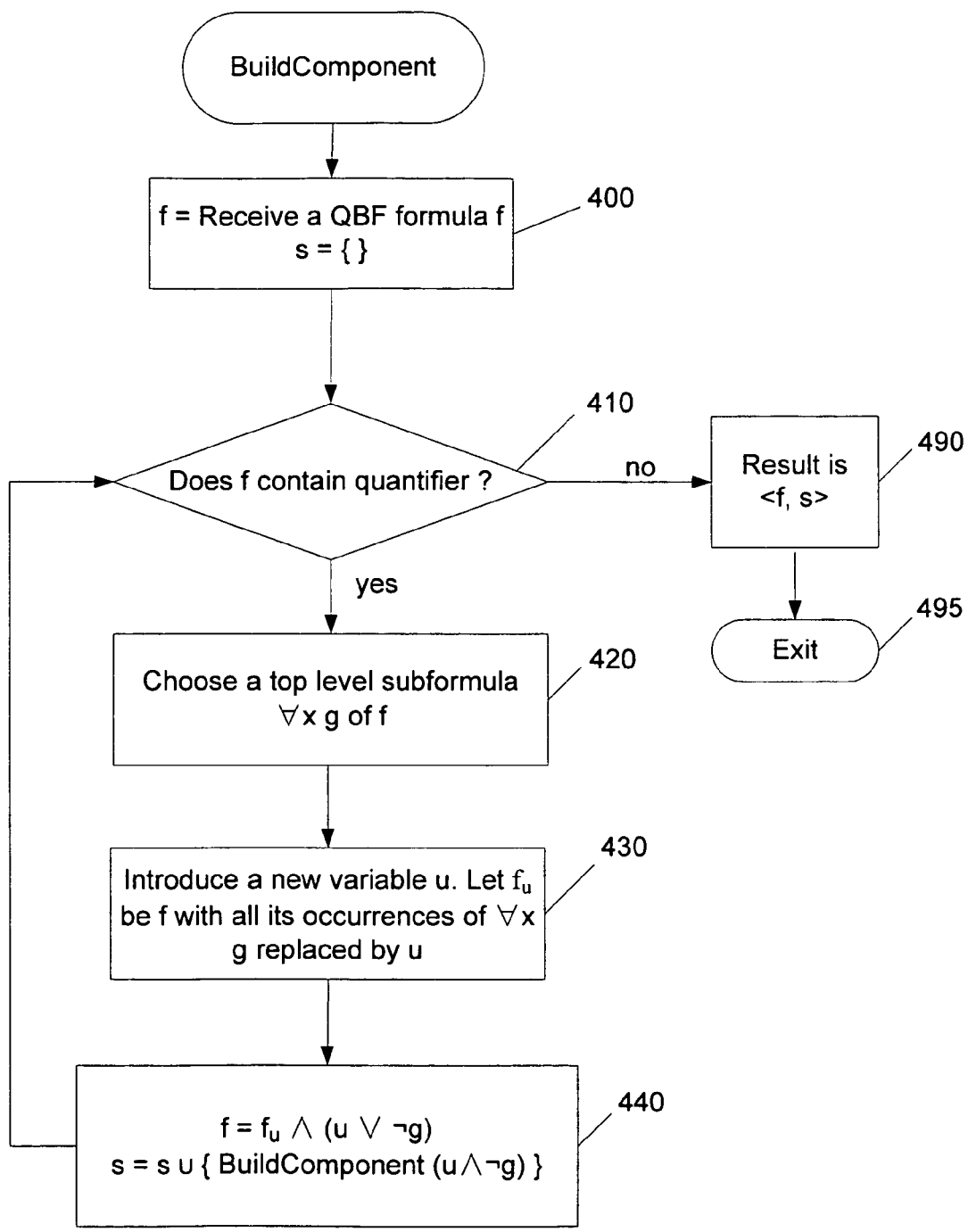
FIG. 4 is a flow diagram of an exemplary method of breaking a QBF into a plurality of component parts.

FIG. 4 is a flow diagram of an exemplary method of converting a QBF formula into a component whose satisfiability is the same as the original QBF. Formally, a component is defined recursively as consisting of a Boolean formula and a set of child components. At step 400, a QBF formula f is received and the set of child components s is initially set to empty.

If f is determined to contain no quantifier at step 410, the procedure outputs the resulting component at step 490 and terminates at step 495. If, on the other hand, f is determined to contain quantifiers, the procedure finds such a subformula of f, denoted by $\forall \ x \ g$, at step 420. The subformula $\forall \ x \ g$ is desirably top-level, meaning that $\forall \ x \ g$ cannot be a subformula of another subformula of form $\forall \ y \ h$.

At step 430, a new Boolean variable u is then introduced for the subformula $\forall \ x \ g$, and a new formula $f_u$ is created by replacing all the occurrences of $\forall \ x \ g$ in f with the variable u. The procedure then rewrites f to be $f_u \wedge (u \vee \neg g)$. The component corresponding to the formula $u \wedge \neg g$ is recursively constructed and added as a child component at step 440. Steps 410 through 440 are repeated until f contains no quantifier.

Figure 5:
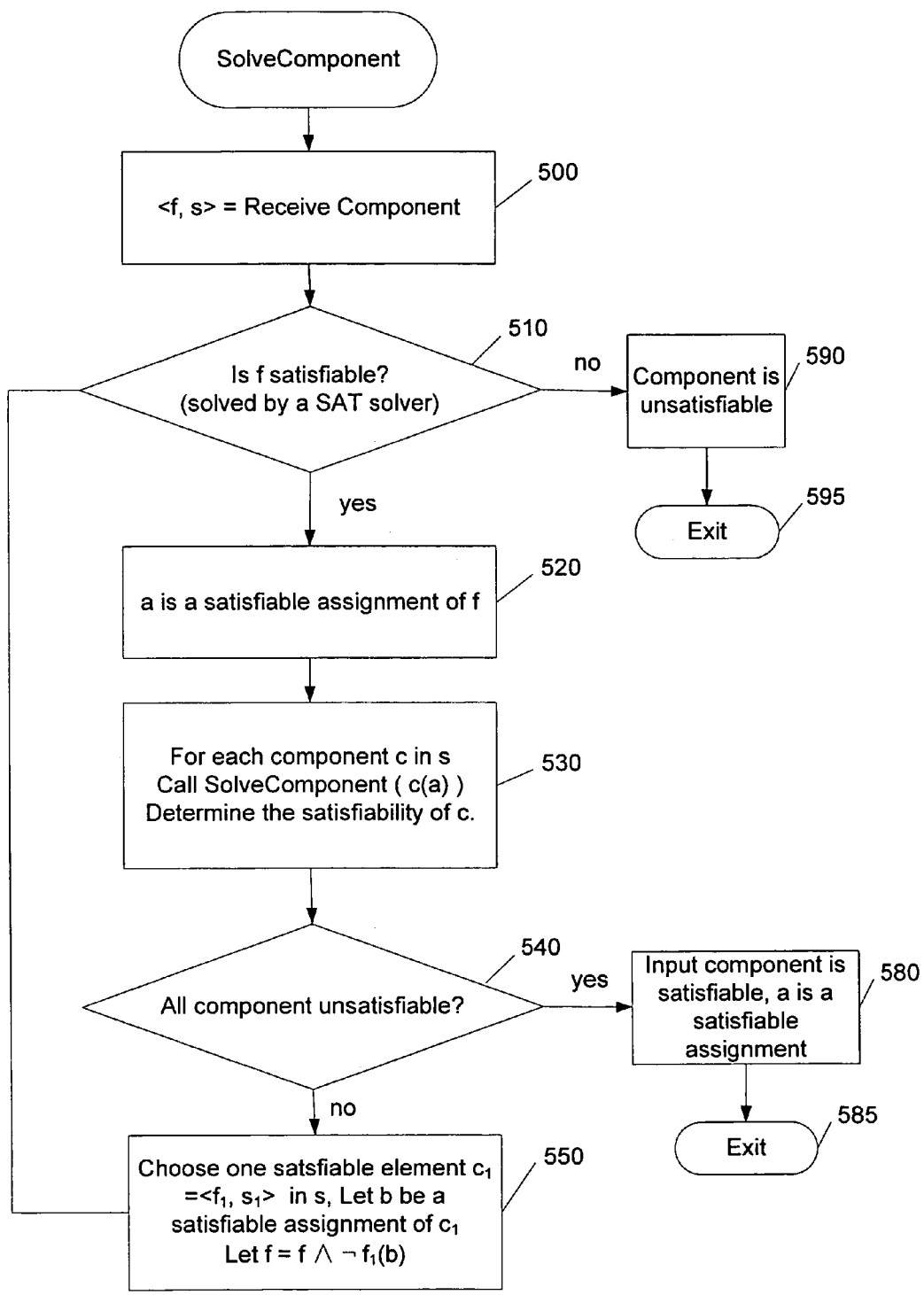
FIG. 5 is a flow diagram of an exemplary method of determining the satisfiability of a component in accordance with the present invention.

FIG. 5 is a flow diagram of an exemplary method of determining the satisfiability of a component in accordance with the present invention. A component consisting of Boolean formula f and a set of child components s is received at step 500. At step 510, the satisfiability of the Boolean formula f is solved desirably by a SAT solver.

If f is determined to be unsatisfiable at step 510, it is concluded that the component is unsatisfiable at step 590, and the procedure ends at step 595. If, on the other hand, f is determined to be satisfiable at step 510, the satisfiable assignment a is noted or stored at step 520 and the satisfiable assignment is conjoined to each of its child components and each combination is tested individually, possibly in parallel, at steps 530. If all the child components are determined to be unsatisfiable, the original component is determined to be satisfiable and the satisfiable assignment a is returned at step 580, and the procedure terminates at step 585. If, on the other hand, some of the child components are satisfiable, then one such component $<f_1, s_1>$ and one of its satisfiable assignments b are chosen at step 550. The Boolean formula f of the original component is replaced with f conjoined with the Boolean formula fi and the assignment b. Steps 510 through 550 are repeated until the component is determined to be either unsatisfiable at step 590 or satisfiable at step 580.

Aspects of the invention, such as those referenced in FIGS. 1-5, are further described with respect to the following example. Assuming a formula H(x) contains quantifiers, e.g., H(x): P(x)∧ ∀ yQ(x,y), it is desirable to determine the satisfiability of this formula. If the formula H(x) is satisfiable, then both operands of ∧in the formula (i.e., P(x) and ∀ yQ(x,y)) must be satisfied.

According to FIG. 3, the component corresponding to H(x) is constructed. According to FIG. 4, a fresh new variable u is introduced for ∀ yQ(x,y). The Boolean formula f of the component is P(x)∧u ∧(u ∨ ¬Q(x, y)), and the set of child components is a singleton set consisting of the component <u ∧¬Q(x, y), { }>. The satisfiability of the constructed component is then determined according to FIG. 5. The satisfiability of f is first determined by a SAT solver. If f is unsatisfiable, then it is determined that the entire formula H(x) is not satisfiable.

If, on the other hand, f is satisfiable, a satisfiable assignment of f is chosen and used to determine the satisfiability of its child components. For this example, let the satisfiable assignment for x and u be $a_x$ and $a_u$ respectively. This assignment is used to determine the satisfiability of the single child component <u ∧¬Q(x, y), { }>.

To determine the satisfiability of <u ∧¬Q(x, y), { }> under the assignment of $a_x$ and $a_u$, The procedure described in FIG. 5 is invoked again. However, in this case, this child component contains no child component. If this child component is determined to be unsatisfiable, the original QBF formula is determined to be satisfiable, with the satisfiable assignment $a_x$.

If, on the other hand, this child component is satisfiable under the assignment of $a_x$ and $a_x$, a satisfiable assignment is returned. The satisfiable assignment is for variable y and will be denoted as $a_y$. The original component's Boolean formula f is updated. In the notation of Step 550 of FIG. 5, $f_1$ is u ∧¬Q(x, y) and b is $a_y$, so the new Boolean formula f is P(x) ∧u ∧(u ∨ ¬Q(x, y)) ∧¬(x, $a_y$)). The procedure repeats with the new f until the satisfiability is determined.

Thus, techniques to the QBF satisfiability problem are provided. An example algorithm design in pseudo-code is provided below for determining the satisfiability of a QBF. Example techniques take advantage of the structure of the original formula, and break a QBF problem into a set of smaller (Q)BF problems, which are then solved in parallel.

An exemplary procedure for constructing the component structure for a QBF is as follows. BuildComponent(f) produces the component corresponding to the QBF f. The resulting component is represented as a pair whose first element is a Boolean formula and whose second element is a set of components.

```
BuildComponent(f) {
    s = { };
    while (f contains quantifiers) {
        h = choose a top-level subformula ∀ x g of f;
        u = a new fresh variable for h;
        f_u = f with all occurrences of h replaced by u;
        f = f_u ∧(u ∨¬g);
        s = s ∪ { BuildComponent(u ∧¬g) };
    }
    return <f, s>;
}
```

An exemplary decision procedure for solving a component is as follows. SolveComponent(c) decides if the input component c is satisfiable. If c is satisfiable, SolveComponent(c) produces a satisfiable assignment. The following procedure assumes the availability of a SAT solver Solve-SAT. Given a Boolean formula f, SolveSAT(f) either reports that f is unsatisfiable, or returns a satisfiable assignment for formula f.

```
SolveComponent(c) {
    f = the Boolean formula of c;
    s = the set of child components of c;
    while (true) {
        a = SolveSAT(f);
        if(a is unsatisfiable) {
            return unsatifiable;
        }
        done = true;
        foreach (c1 in s) do {
            a1 = SolveComponent(c1(a) );
            if(a1 is satisfiable) {
                f1 = the Boolean formula of c1;
                f = f ∧ ¬f1(a1);
                done = false;
                goto LOOP_END;
            }
        }
        LOOP_END: if(done) {
            return f is satisfiable with satisfiable assignment a;
        }
    }
}
```

The decision procedure for solving a QBF is as follows.

```
SolveQBF(f) {
    c = BuildComponent(f);
    return SolveComponent(c);
}
```

EXAMPLE COMPUTING ENVIRONMENT

Figure 6:
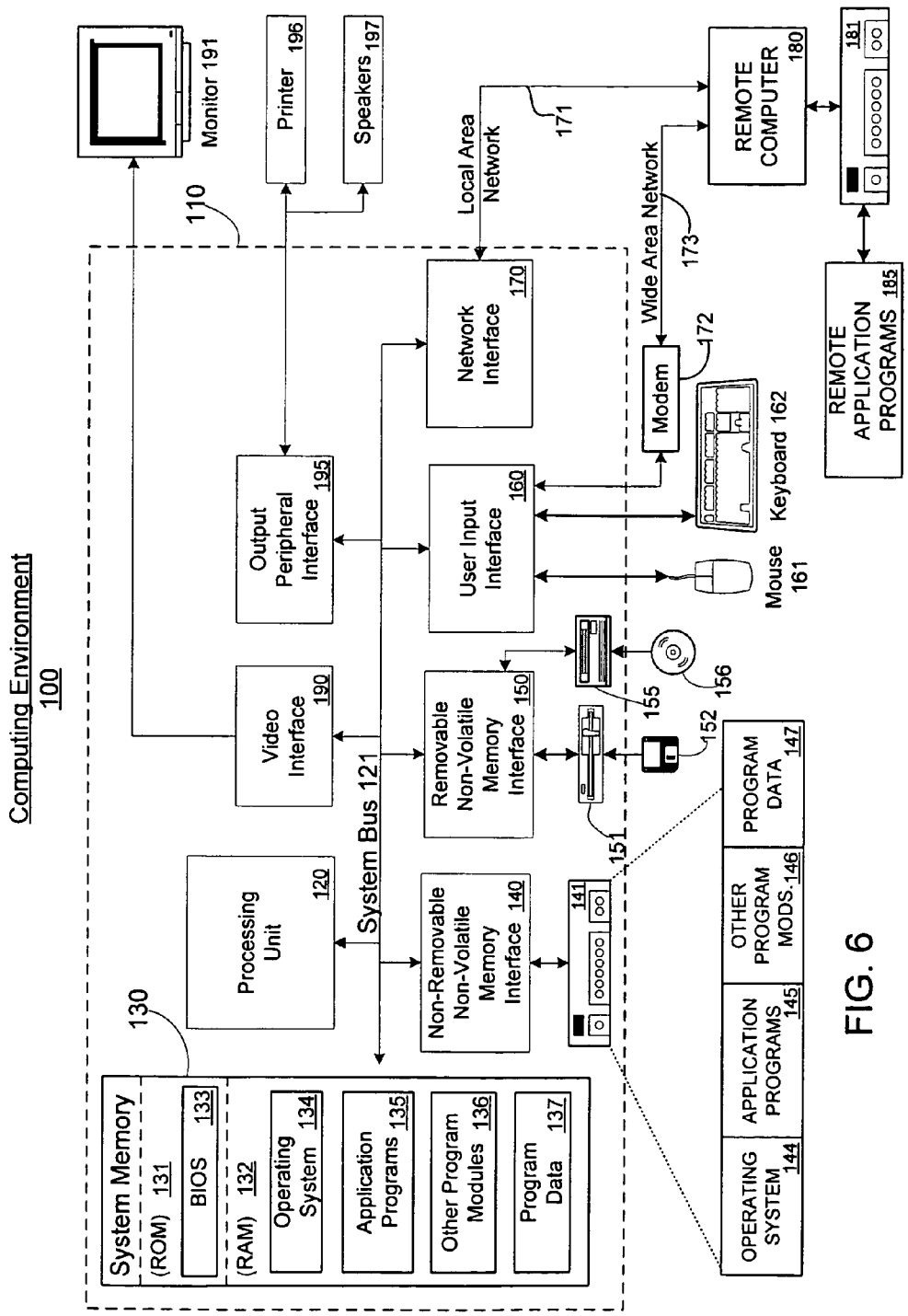
FIG. 6 is a block diagram showing an example computing environment in which aspects of the invention may be implemented.

FIG. 6 and the following discussion are intended to provide a brief general description of a suitable computing environment in which an example embodiment of the invention may be implemented. It should be understood, however, that handheld, portable, and other computing devices of all kinds are contemplated for use in connection with the present invention. While a general purpose computer is described below, this is but one example. The present invention also may be operable on a thin client having network server interoperability and interaction. Thus, an example embodiment of the invention may be implemented in an environment of networked hosted services in which very little or minimal client resources are implicated, e.g., a networked environment in which the client device serves merely as a browser or interface to the World Wide Web.

Although not required, the invention can be implemented via an application programming interface (API), for use by a developer or tester, and/or included within the network browsing software which will be described in the general context of computer-executable instructions, such as program modules, being executed by one or more computers (e.g., client workstations, servers, or other devices). Generally, program modules include routines, programs, objects, components, data structures and the like that perform particular tasks or implement particular abstract data types. Typically, the functionality of the program modules may be combined or distributed as desired in various embodiments. Moreover, those skilled in the art will appreciate that the invention may be practiced with other computer system configurations. Other well known computing systems, environments, and/or configurations that may be suitable for use with the invention include, but are not limited to, personal computers (PCs), automated teller machines, server computers, hand-held or laptop devices, multi-processor systems, microprocessor-based systems, programmable consumer electronics, network PCs, minicomputers, mainframe computers, and the like. An embodiment of the invention may also be practiced in distributed computing environments where tasks are performed by remote processing devices that are linked through a communications network or other data transmission medium. In a distributed computing environment, program modules may be located in both local and remote computer storage media including memory storage devices.

FIG. 6 thus illustrates an example of a suitable computing system environment 100 in which the invention may be implemented, although as made clear above, the computing system environment 100 is only one example of a suitable computing environment and is not intended to suggest any limitation as to the scope of use or functionality of the invention. Neither should the computing environment 100 be interpreted as having any dependency or requirement relating to any one or combination of components illustrated in the exemplary operating environment 100.

With reference to FIG. 6, an example system for implementing the invention includes a general purpose computing device in the form of a computer 110. Components of computer 110 may include, but are not limited to, a processing unit 120, a system memory 130, and a system bus 121 that couples various system components including the system memory to the processing unit 120. The system bus 121 may be any of several types of bus structures including a memory bus or memory controller, a peripheral bus, and a local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus (also known as Mezzanine bus).

Computer 110 typically includes a variety of computer readable media. Computer readable media can be any available media that can be accessed by computer 110 and includes both volatile and nonvolatile, removable and non-removable media. By way of example, and not limitation, computer readable media may comprise computer storage media and communication media. Computer storage media includes both volatile and nonvolatile, removable and non-removable media implemented in any method or technology for storage of information such as computer readable instructions, data structures, program modules or other data. Computer storage media includes, but is not limited to, random access memory (RAM), read-only memory (ROM), Electrically-Erasable Programmable Read-Only Memory (EEPROM), flash memory or other memory technology, compact disc read-only memory (CDROM), digital versatile disks (DVD) or other optical disk storage, magnetic cassettes, magnetic tape, magnetic disk storage or other magnetic storage devices, or any other medium which can be used to store the desired information and which can be accessed by computer 110.

The system memory 130 includes computer storage media in the form of volatile and/or nonvolatile memory such as ROM 131 and RAM 132. A basic input/output system 133 (BIOS), containing the basic routines that help to transfer information between elements within computer 110, such as during start-up, is typically stored in ROM 131. RAM 132 typically contains data and/or program modules that are immediately accessible to and/or presently being operated on by processing unit 120. By way of example, and not limitation, FIG. 6 illustrates operating system 134, application programs 135, other program modules 136, and program data 137. RAM 132 may contain other data and/or program modules.

The computer 110 may also include other removable/non-removable, volatile/nonvolatile computer storage media. By way of example only, FIG. 6 illustrates a hard disk drive 141 that reads from or writes to non-removable, nonvolatile magnetic media, a magnetic disk drive 151 that reads from or writes to a removable, nonvolatile magnetic disk 152, and an optical disk drive 155 that reads from or writes to a removable, nonvolatile optical disk 156, such as a CD ROM or other optical media. Other removable/non-removable, volatile/nonvolatile computer storage media that can be used in the example operating environment include, but are not limited to, magnetic tape cassettes, flash memory cards, digital versatile disks, digital video tape, solid state RAM, solid state ROM, and the like. The hard disk drive 141 is typically connected to the system bus 121 through a non-removable memory interface such as interface 140, and magnetic disk drive 151 and optical disk drive 155 are typically connected to the system bus 121 by a removable memory interface, such as interface 150.

The drives and their associated computer storage media discussed above and illustrated in FIG. 6 provide storage of computer readable instructions, data structures, program modules and other data for the computer 110. In FIG. 6, for example, hard disk drive 141 is illustrated as storing operating system 144, application programs 145, other program modules 146, and program data 147. Note that these components can either be the same as or different from operating system 134, application programs 135, other program modules 136, and program data 137. Operating system 144, application programs 145, other program modules 146, and program data 147 are given different numbers here to illustrate that, at a minimum, they are different copies. A user may enter commands and information into the computer 110 through input devices such as a keyboard 162 and pointing device 161, commonly referred to as a mouse, trackball or touch pad. Other input devices (not shown) may include a microphone, joystick, game pad, satellite dish, scanner, or the like. These and other input devices are often connected to the processing unit 120 through a user input interface 160 that is coupled to the system bus 121, but may be connected by other interface and bus structures, such as a parallel port, game port or a universal serial bus (USB).

A monitor 191 or other type of display device is also connected to the system bus 121 via an interface, such as a video interface 190. In addition to monitor 191, computers may also include other peripheral output devices such as speakers 197 and printer 196, which may be connected through an output peripheral interface 195.

The computer 110 may operate in a networked environment using logical connections to one or more remote computers, such as a remote computer 180. The remote computer 180 may be a personal computer, a server, a router, a network PC, a peer device or other common network node, and typically includes many or all of the elements described above relative to the computer 110, although only a memory storage device 181 has been illustrated in FIG. 6. The logical connections depicted in FIG. 6 include a local area network (LAN) 171 and a wide area network (WAN) 173, but may also include other networks. Such networking environments are commonplace in offices, enterprise-wide computer networks, intranets and the Internet.

When used in a LAN networking environment, the computer 110 is connected to the LAN 171 through a network interface or adapter 170. When used in a WAN networking environment, the computer 110 typically includes a modem 172 or other means for establishing communications over the WAN 173, such as the Internet. The modem 172, which may be internal or external, may be connected to the system bus 121 via the user input interface 160, or other appropriate mechanism. In a networked environment, program modules depicted relative to the computer 110, or portions thereof, may be stored in the remote memory storage device. By way of example, and not limitation, FIG. 6 illustrates remote application programs 185 as residing on memory device 181. It will be appreciated that the network connections shown are exemplary and other means of establishing a communications link between the computers may be used.

One of ordinary skill in the art can appreciate that a computer 110 or other client devices can be deployed as part of a computer network. In this regard, the present invention pertains to any computer system having any number of memory or storage units, and any number of applications and processes occurring across any number of storage units or volumes. An embodiment of the present invention may apply to an environment with server computers and client computers deployed in a network environment, having remote or local storage. The present invention may also apply to a standalone computing device, having programming language functionality, interpretation and execution capabilities.

The various systems, methods, and techniques described herein may be implemented with hardware or software or, where appropriate, with a combination of both. Thus, the methods and apparatus of the present invention, or certain aspects or portions thereof, may take the form of program code (i.e., instructions) embodied in tangible media, such as floppy diskettes, CD-ROMs, hard drives, or any other machine-readable storage medium, wherein, when the program code is loaded into and executed by a machine, such as a computer, the machine becomes an apparatus for practicing the invention. In the case of program code execution on programmable computers, the computer will generally include a processor, a storage medium readable by the processor (including volatile and non-volatile memory and/or storage elements), at least one input device, and at least one output device. One or more programs are preferably implemented in a high level procedural or object oriented programming language to communicate with a computer system. However, the program(s) can be implemented in assembly or machine language, if desired. In any case, the language may be a compiled or interpreted language, and combined with hardware implementations.

The methods and apparatus of the present invention may also be embodied in the form of program code that is transmitted over some transmission medium, such as over electrical wiring or cabling, through fiber optics, or via any other form of transmission, wherein, when the program code is received and loaded into and executed by a machine, such as an EPROM, a gate array, a programmable logic device (PLD), a client computer, a video recorder or the like, the machine becomes an apparatus for practicing the invention. When implemented on a general-purpose processor, the program code combines with the processor to provide a unique apparatus that operates to perform the functionality of the present invention.

While the present invention has been described in connection with the preferred embodiments of the various figures, it is to be understood that other similar embodiments may be used or modifications and additions may be made to the described embodiments for performing the same functions of the present invention without deviating therefrom. Therefore, the present invention should not be limited to any single embodiment, but rather construed in breadth and scope in accordance with the appended claims.

What is claimed:

1. A method of solving a quantified Boolean formula (QBF), comprising:
    abstracting a QBF into a propositional Boolean formula comprising replacing subformulas that contain quantifiers with variables;
    solving the Boolean formula;
    recursively justifying the variables assigned for the abstracted subformulas;
    if the justifying is unsuccessful, then refining the abstraction by adding constraints to the propositional Boolean formula and repeating solving the Boolean formula; and
    outputting a result to a storage device.

2. The method of claim 1, wherein if the justifying is successful, the QBF is solved.

3. The method of claim 1, wherein the constraints are determined from the justifying.

4. The method of claim 1, wherein the solving is performed by a satisfiability (SAT) solver.

5. A computer-implemented quantified Boolean formula (QBF) solver system, comprising:
    means for abstracting a QBF into a propositional Boolean formula comprising replacing subformulas that contain quantifiers with variables;
    means for solving the Boolean formula;
    means for recursively justifying the variables assigned for the abstracted subformulas;
    means for refining the abstraction by adding constraints to the propositional Boolean formula and repeating solving the Boolean formula if the justifying is unsuccessful; and
    means for outputting a result to a storage device.

6. The system of claim 5, wherein if the justifying is successful, the QBF is solved.

7. The system of claim 5, wherein the constraints are determined from the justifying.

8. The system of claim 5, wherein the means for solving comprises a satisfiability (SAT) solver.

9. A computer readable medium having stored thereon computer executable instructions for performing a method of solving a quantified Boolean formula (QBF), the method comprising:
    abstracting a QBF into a propositional Boolean formula comprising replacing subformulas that contain quantifiers with variables;
    solving the Boolean formula;
    recursively justifying the variables assigned for the abstracted subformulas;
    if the justifying is unsuccessful, then refining the abstraction by adding constraints to the propositional Boolean formula and repeating solving the Boolean formula; and
    outputting a result to a storage device.

10. The computer readable medium of claim 9, wherein if the justifying is successful, the QBF is solved.

11. The computer readable medium of claim 9, wherein the constraints are determined from the justifying.

12. The computer readable medium of claim 9, wherein the solving is performed by a satisfiability (SAT) solver.

* * * * *